United States Patent
Taito et al.

(10) Patent No.: US 7,630,242 B2
(45) Date of Patent: Dec. 8, 2009

(54) NONVOLATILE SEMICONDUCTOR MEMORY DEVICE

(75) Inventors: Yasuhiko Taito, Tokyo (JP); Naoki Otani, Tokyo (JP); Tomohisa Iba, Itami (JP); Tsukasa Oishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 87 days.

(21) Appl. No.: 12/073,834

(22) Filed: Mar. 11, 2008

(65) Prior Publication Data
US 2008/0225592 A1  Sep. 18, 2008

(30) Foreign Application Priority Data
Mar. 14, 2007  (JP) .............................. 2007-065542

(51) Int. Cl.
*G11C 16/04* (2006.01)
(52) U.S. Cl. .............................. 365/185.11; 365/185.23; 365/189.04
(58) Field of Classification Search ............ 365/185.11, 365/185.12, 185.23, 185.29, 189.04
See application file for complete search history.

(56) References Cited

U.S. PATENT DOCUMENTS

| 5,371,702 A | * 12/1994 | Nakai et al. ............. 365/185.11 |
| 5,455,789 A | * 10/1995 | Nakamura et al. ...... 365/185.17 |
| 6,512,693 B2 | * 1/2003 | Honda et al. ........... 365/185.13 |

FOREIGN PATENT DOCUMENTS

| JP | 2001-210808 | 8/2001 |
| JP | 2003-031704 | 1/2003 |

* cited by examiner

*Primary Examiner*—Gene N. Auduong
(74) *Attorney, Agent, or Firm*—McDermott Will & Emery LLP

(57) ABSTRACT

With this flash memory, because a plurality of memory blocks are formed on a surface of a single P-type well, a layout area can be made small. Further, when erasing data for a memory block to be erased, a voltage of the P-type well is applied to all word lines of a memory block to be not erased. Consequently, the voltage of the P-type well and the voltage of all word lines of the memory block to be not erased change at the same time. With this, it is possible to prevent a threshold voltage for the memory block to be not erased from changing.

8 Claims, 10 Drawing Sheets

|  | BLOCK TO BE ERASED | | | | BLOCK TO BE NOT ERASED | | | |
|---|---|---|---|---|---|---|---|---|
|  | WELL | SOURCE | DRAIN | GATE | WELL | SOURCE | DRAIN | GATE |
| ERASURE | +8V | +8V | +7.4V | −8V | +8V | +8V | +7.4V | +8V |
| PRE-ERASURE WRITING | −8V | −8V | −8V | +8V | −8V | −8V | −8V | −8V |

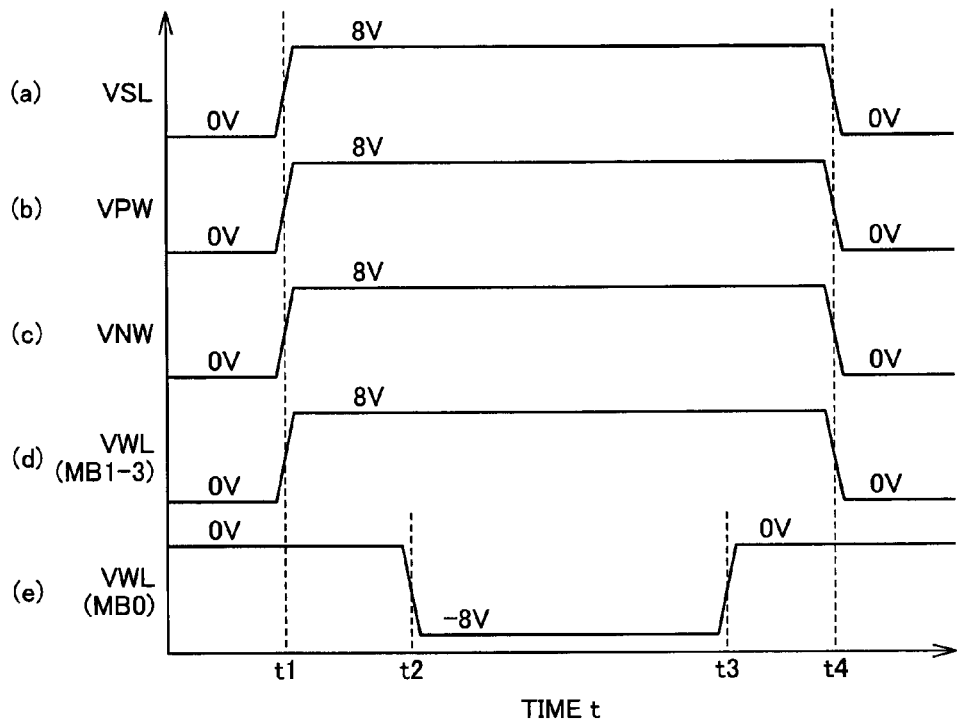
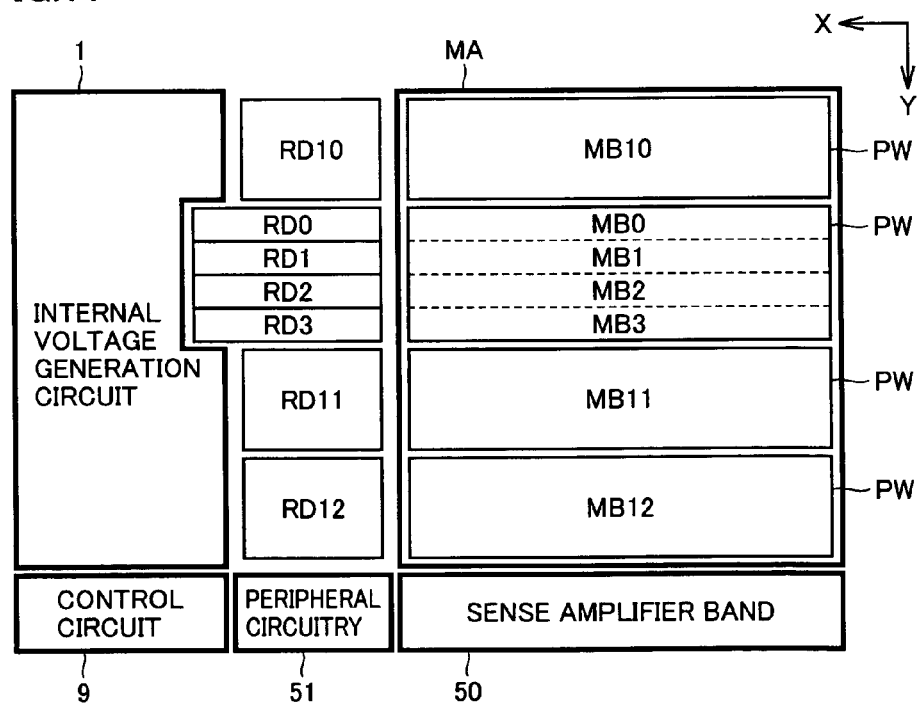

NONVOLATILE SEMICONDUCTOR MEMORY DEVICE

BACKGROUND OF THE INVENTION

1. Field of the Invention

The present invention relates to nonvolatile semiconductor memory devices. In particular, the present invention relates to a nonvolatile semiconductor memory device capable of conduct batch erasure of data for memory block to be erased out of a plurality of memory blocks formed in a single well.

2. Description of the Background Art

Conventionally, with a flash memory, a memory array is segmented into a plurality of memory blocks, and data can be erased by memory block. For a first flash memory, each memory block is formed on a surface of an independent well, and a predetermined erasing voltage is applied between a well for a memory block to be erased and word lines of the memory block, thereby erasing data. At this time, 0 V is applied to both a well for a memory block to be not erased and to the word lines of the memory block, so that change in a threshold voltage of a memory cell may be prevented (See Japanese Patent Laying-Open No. 2001-210808, for example).

Further, for a second flash memory, a plurality of memory blocks are formed on a surface of a single well, and a predetermined erasing voltage is applied between the well and word lines of a memory block to be erased, thereby erasing data. At this time, a voltage of the same level that is applied to the well is applied to the word lines of a memory block to be not erased, so that change in a threshold voltage for a memory cell may be prevented (See Japanese Patent Laying-Open No. 2003-031704, for example).

However, with the first flash memory, because each memory block is formed on the surface of an independent well, a separation region is required for separating wells. This poses a problem that a layout area increases by the amount of the separation region.

Further, with the second flash memory, because the plurality of memory blocks are formed on the surface of the single well, a separation region for separating wells is not required, and it is possible to reduce the layout area by that region. However, with this type of flash memory, voltages from independent power supplies are applied to the word line and the well, respectively, and therefore a problem has been noted that the voltage to the word line having a capacity smaller than the well rises faster than the voltage to the well to generate a voltage between the word line and the well, thereby changing the threshold voltage of the memory cell.

Further, with a microcomputer provided with both the first and the second flash memories, an amount of memory required may vary depending on the application, and some of the memory blocks may be deleted to reduce the amount of memory. In such a case, it is necessary to re-layout a peripheral circuitry, and accordingly, the amount of memory may not be easily adjusted.

SUMMARY OF THE INVENTION

Thus, a main object of the present invention is to provide a nonvolatile semiconductor memory device having a reduced layout area and capable of preventing change in a threshold voltage of a memory cell to be not erased.

Further, another object of the present invention is to provide a nonvolatile semiconductor memory device capable of facilitating adjustment of an amount of memory.

A nonvolatile semiconductor memory device according to one embodiment of the present invention includes a plurality of memory blocks and an erase circuit. The plurality of memory blocks is formed on a surface of a single well, each memory block having a plurality of memory cells that are arranged in a plurality of rows and a plurality of columns, and a word line provided corresponding to each row and connected to a gate of corresponding each memory cell. The erase circuit conducts batch erasure of stored data for the plurality of memory cells included in a memory block to be erased out of the plurality of memory blocks. Here, a source of each memory cell of the plurality of memory blocks is connected to a predetermined node. Further, the erase circuit includes a first and a second drive circuits. The first drive circuit applies a first voltage to the well and the predetermined node. The second drive circuit applies the output voltage of the first drive circuit to each word line of a memory block to be not erased out of the plurality of memory blocks, as well as a second voltage to each word line of the memory block to be erased, the second voltage being different form the first voltage.

With this nonvolatile semiconductor memory device, because the plurality of memory blocks are formed on the surface of the single well, a layout area may be small. Further, because the output voltage of the first drive circuit that applies the first voltage to the well and the source of each memory cell is applied to each word line of the memory block to be not erased, the voltage of the well and the source of each memory cell and the voltage of the each word line of the memory block to be not erased changes at the same time. Therefore, it is possible to prevent the threshold voltage of the memory cell not to be erased from changing.

Further, a nonvolatile semiconductor memory device according to another embodiment of the present invention includes a plurality of first memory blocks, a first row decoder, a plurality of second memory blocks, and a second row decoder. The plurality of first memory blocks are formed on a surface of a single first well, and each first memory block includes a plurality of memory cells that are arranged in a plurality of rows and a plurality of columns and a word line provided corresponding to each row and connected to a gate of corresponding each memory cell. The first row decoder is provided corresponding to each of the first memory blocks, and applies a first voltage that is different from a second voltage applied to the first well to a corresponding each word line when the corresponding first memory block is to be erased, as well as the second voltage to the corresponding each word line when the corresponding first memory block is to be not erased but another first memory block is to be erased. The plurality of second memory blocks are respectively formed on surfaces of a plurality of second wells, and each second memory block includes a plurality of memory cells that are arranged in a plurality of rows and a plurality of columns and a word line provided corresponding to each row and connected to a gate of corresponding each memory cell. The second row decoder is provided corresponding to each of the second memory blocks, and applies a third voltage that is different from a fourth voltage applied to the second well to a corresponding word line when the corresponding second memory block is to be erased, as well as the fourth voltage to the corresponding word line when the corresponding second memory block is to be not erased. Here, the plurality of first memory blocks and the plurality of second memory blocks are sequentially arranged in a first direction that is perpendicular to a second direction in which the word line extends, and a plurality of the first row decoders and a plurality of the second row decoders are sequentially arranged in the first direction adjacent to the plurality of first memory blocks and the plurality of second memory blocks in the second direction.

With this nonvolatile semiconductor memory device, the plurality of first memory blocks and the plurality of second memory blocks are sequentially arranged in a direction perpendicular to the direction in which the word line extends. Consequently, even when the second memory block is deleted to reduce an amount of memory, re-layout of peripheral circuitry is unnecessary and adjustment of the amount of memory can be facilitated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a time chart illustrating the voltage applied to the memory cell during the erase operation of the flash memory illustrated in FIGS. 1A to FIG. 7.

FIG. 11 is a block diagram illustrating problems of a flash module including the flash memory of First Embodiment.

DESCRIPTION OF THE PREFERRED EMBODIMENTS

First Embodiment

Figure 1:
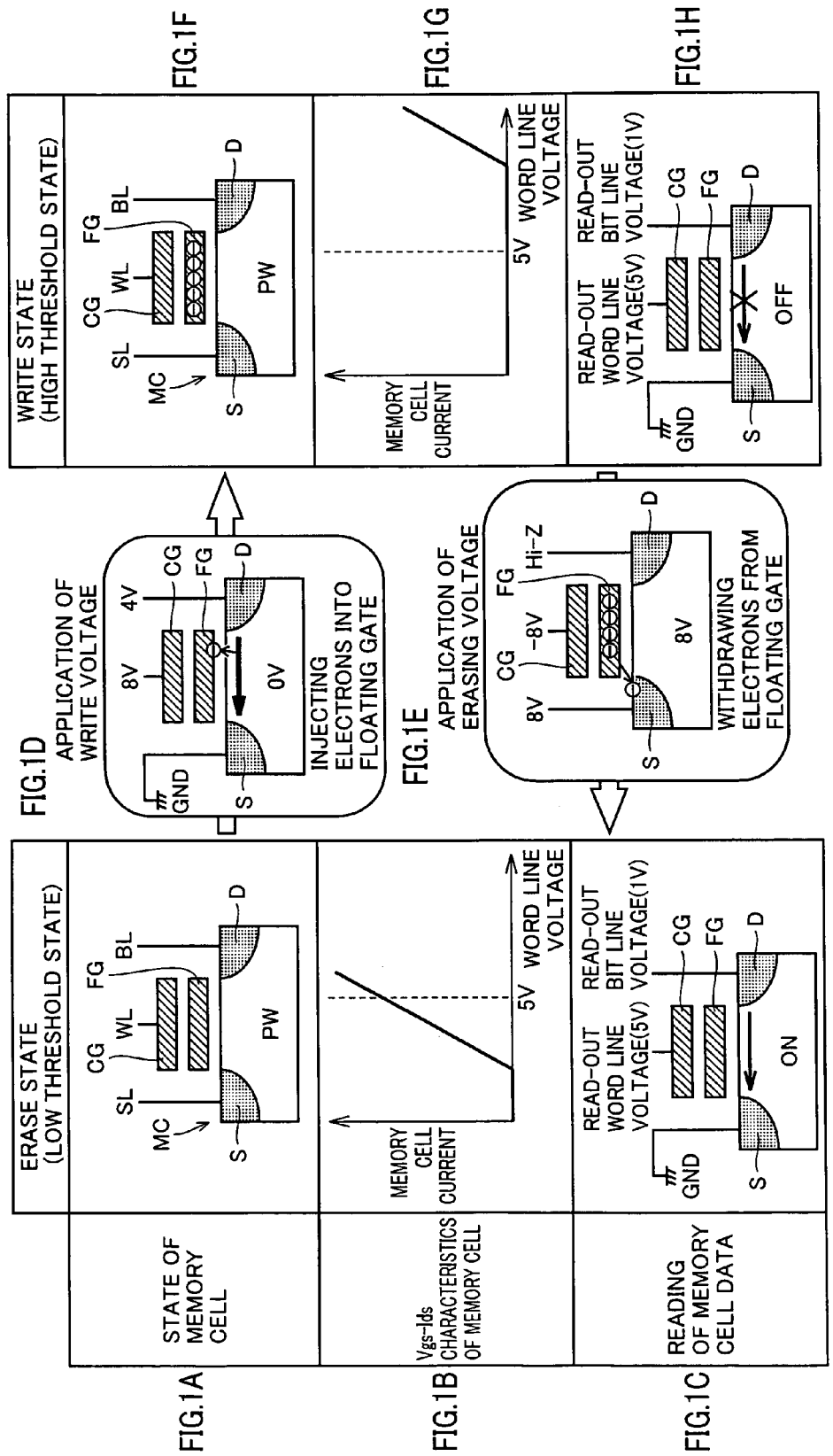
FIGS. 1A to 1H illustrate a configuration and an operation of a memory cell for a flash memory according to First Embodiment of the present invention.

FIGS. 1A to 1H illustrate a configuration and an operation of a memory cell for a flash memory according to First Embodiment of the present invention. In FIGS. 1A to 1H, a memory cell MC is such that a floating gate FG is formed on a surface of a P-type well PW with an insulation layer (not shown) therebetween, a control gate CG is further formed over floating gate FG with an insulation layer (not shown) therebetween, and then a source S and a drain D are formed by implanting an N-type impurity into both sides of gates FG and CG. Control gate CG is connected to a word line WL, source S is connected to a source line SL, and drain D is connected to a bit line BL.

Memory cell MC stores data representing either "0" or "1", depending on whether or not electrons are accumulated in floating gate FG. Here, a state in which electrons are not accumulated in floating gate FG as illustrated in FIG. 1A is referred to as an erase state (or low threshold state), and a state in which electrons are accumulated in floating gate FG as illustrated in FIG. 1F is referred to as a write state (or high threshold state).

The data stored in memory cell MC is read out by, as illustrated in FIGS. 1C and 1H, applying a read-out word line voltage (about 5 V) to control gate CG, applying a read-out bit line voltage (about 1 V) to drain D, and grounding source S. In the erase state, as illustrated in FIGS. 1B and 1C, because the threshold voltage of memory cell MC is low, memory cell MC is turned on and memory cell current flows. Further, in the write state, as illustrated in FIGS. 1G and 1H, because the threshold voltage of memory cell MC is high, memory cell MC is not turned on and little memory cell current flows. Accordingly, it is possible to read out the data stored in memory cell MC by detecting the memory cell current, when applying read-out voltage.

Further, in order to change the state of memory cell MC from the erase state to the write state, as illustrated in FIG. 1D, a write word line voltage (8 V) is applied to control gate CG, a write bit line voltage (4 V) is applied to drain D, and source S and P-type well PW are grounded. With this, channel hot electrons are injected into floating gate FG, and the state of memory cell MC shifts from the erase state to the write state. By contrast, in order to change the state of memory cell MC from the write state to the erase state, as illustrated in FIG. 1E, an erase word line voltage (–8 V) is applied to control gate CG, drain D is set to a high-impedance state (floating state), and erase well voltage (8 V) is applied to source S and P-type well PW. With this, the electrons in floating gate FG are withdrawn to source S due to Fowler-Nordheim tunneling, and the state of memory cell MC shifts from the write state to the erase state.

Further, although not illustrated in FIGS. 1A to 1H, generally, in order to shift the state of memory cell MC to the erase state, a pre-erasure write operation is performed in which memory cell MC to be erased are set to the high threshold state before applying voltages of –8 V, 8 V, and 8 V respectively to word line WL, source line SL, and P-type well PW for memory cell MC to be erased. This is because when an erasure stress voltage is applied until the state of memory cell MC in the high threshold state shifts to the low threshold state while memory cell MC to be erased, memory cell MC originally in the high threshold state, and memory cell MC in the low threshold state are mixed, distribution of the threshold voltage for memory cell MC originally in the low threshold state becomes too low. Because memory cell MC may be turned on even when the read-out word line voltage (gate voltage) is 0 V when the threshold voltage memory cell MC is too low, it is necessary to make a threshold state for memory cell MC prior to application of the erasure stress voltage.

An example of methods of performing the pre-erasure writing is such that, a polarity of voltage is reversed from the erasure stress voltage, word line WL, source line SL, and P-type well PW for memory cell MC are applied respectively with 8 V, –8 V, and –8 V to cause Fowler-Nordheim tunneling, thereby shifting the state of memory cell MC to the high threshold state.

Figure 2:
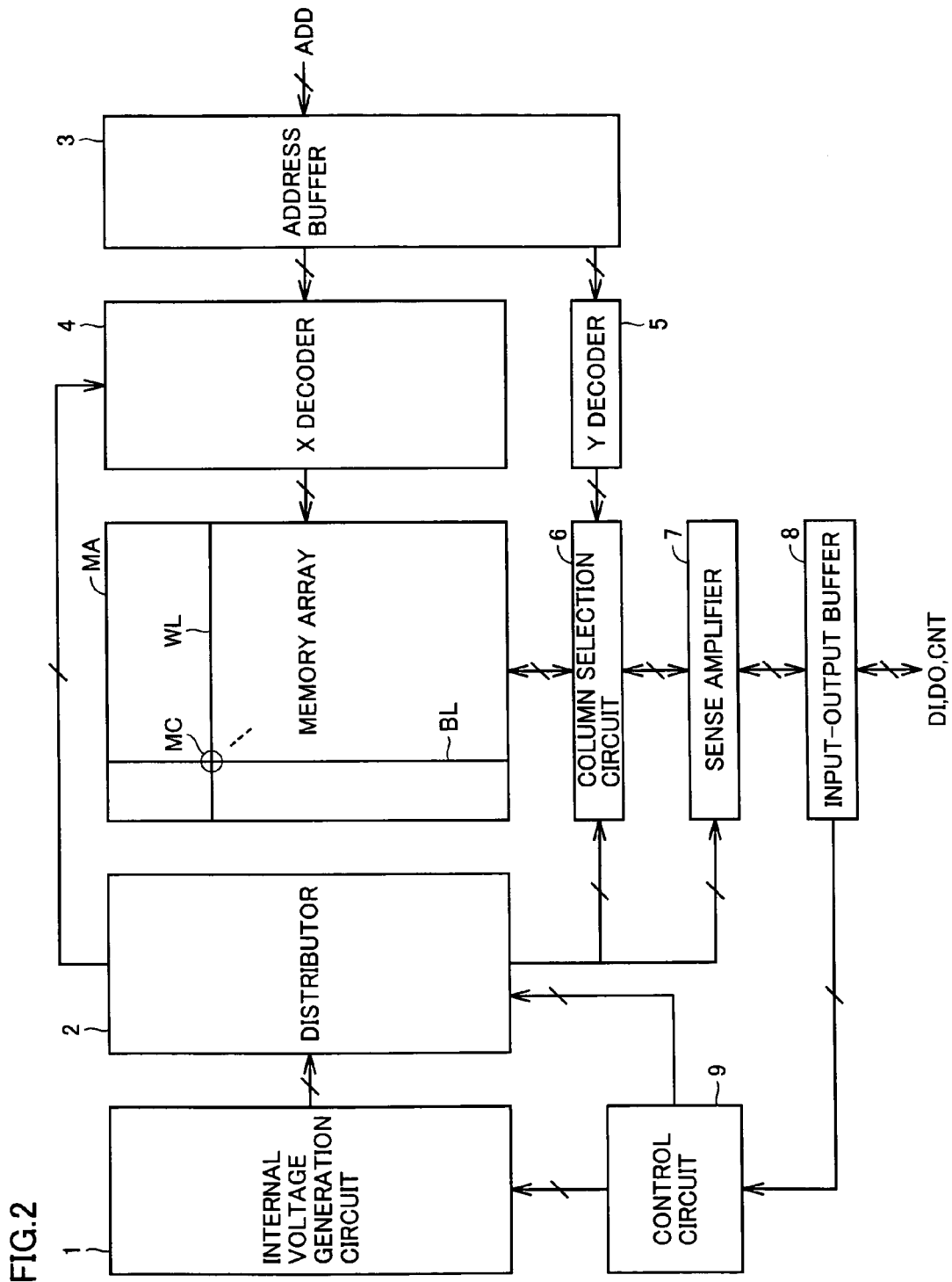
FIG. 2 is a block diagram illustrating an entire configuration of the flash memory using the memory cell illustrated in FIGS. 1A to 1H.

FIG. 2 is a block diagram illustrating an entire configuration of the flash memory including memory cell MC illustrated in FIGS. 1A to 1H. In FIG. 2, the flash memory is provided with a memory array MA, an internal voltage generation circuit 1, a distributor 2, an address buffer 3, an X decoder 4, a Y decoder 5, a column selection circuit 6, a sense amplifier 7, an input-output buffer 8, and a control circuit 9.

Memory array MA includes a plurality of memory cells MC arranged in a plurality of rows and a plurality of columns. Each memory cell MC stores data of 1 bit, as illustrated in FIGS. 1A to 1H. Each memory cell MC is allocated with a unique address. Internal voltage generation circuit 1 generates various internal voltages (8 V, −8 V, about 5 V, 4 V, and about 1 V) as illustrated in FIGS. 1A to 1H. Distributor 2 distributes the various internal voltages generated by internal voltage generation circuit 1 according to an operation mode such as erasure, write, or read-out to X decoder 4, column selection circuit 6, sense amplifier 7, and the like.

Address buffer 3 provides X decoder 4 and Y decoder 5 with an X address signal and a Y address signal included in an address signal ADD that are provided from external. X decoder 4 provides the internal voltage provided by distributor 2 to such as word line WL, source line SL, and P-type well PW for memory array MA according to the X address signal provided by address buffer 3. Y decoder 5 specifies one of the plurality of columns of memory array MA according to the Y address signal provided by address buffer 3.

Column selection circuit 6 connects between bit line BL of the column specified by Y decoder 5 and sense amplifier 7. Sense amplifier 7 write and read the data stored in memory cell MC via column selection circuit 6 and bit line BL. Input-output buffer 8 transmits and receives write data signal DI and read data signal DO between the external and sense amplifier 7, and provides control circuit 9 with control signal CNT that is provided from external. Control circuit 9 controls the flash memory as a whole according to control signal CNT.

Figure 3:
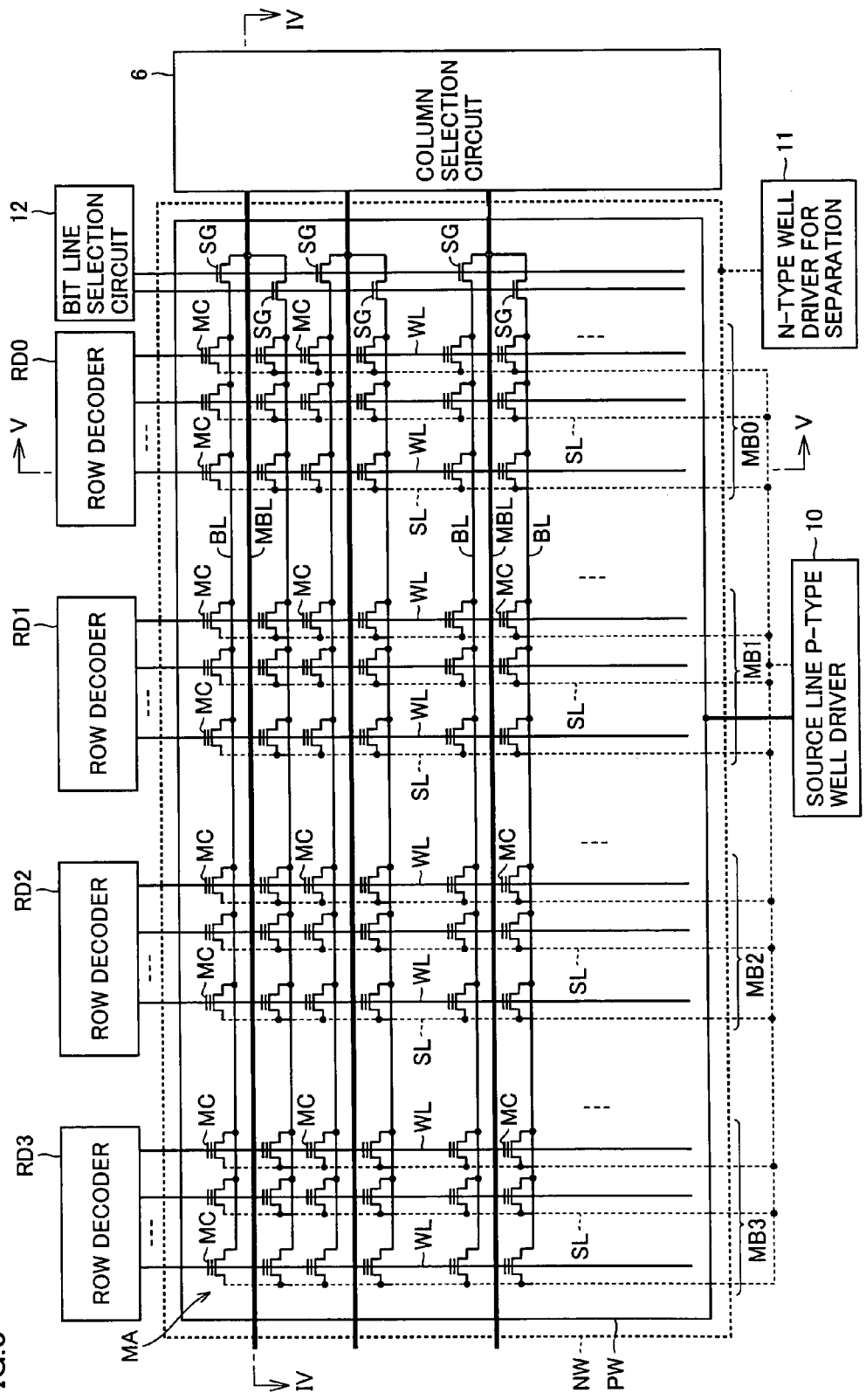
FIG. 3 is a circuitry block diagram illustrating configurations of a memory array and a peripheral circuitry illustrated in FIG. 2.

FIG. 3 is a circuitry block diagram illustrating configurations of memory array MA and a peripheral circuitry illustrated in FIG. 2. In FIG. 3, memory array MA includes the plurality of memory cells MC arranged in the plurality of rows and the plurality of columns, a plurality of word line WL provided correspondingly to the plurality of rows, a plurality of source line SL provided correspondingly to the plurality of rows, a plurality of bit line BL provided correspondingly to the plurality of columns, selecting gates (N-channel MOS transistor) SG each provided correspondingly to a bit line BL, main bit lines MBL each corresponding to every two adjacent bit lines BL. Each word line WL is connected to control gate CG of each memory cell MC in the corresponding column. Each source line SL is connected to the source of each memory cell MC in the corresponding column. Each bit line BL is connected to the drain of each memory cell MC in the corresponding column. Each selecting gate SG is connected between one end of corresponding bit line BL and corresponding main bit line MBL. Memory array MA is formed on the surface of a single P-type well PW, and P-type well PW is formed on a surface of an N-type well NW for separation.

Memory array MA is segmented into a plurality of memory blocks MB0 to MB3 (four, in the drawing) each having a plurality of memory cell lines, and provided with row decoders RD0 to RD3 respectively corresponding to four memory blocks MB0 to MB3. Each of row decoders RD0 to RD3 provides word line WL selected out of the plurality of word line WL of a corresponding memory block MB with a voltage corresponding to the operation mode such as erasure, write, or read.

All of source lines SL and P-type wells PW are connected to source line P-type well driver 10. Driver 10 provides all of source lines SL and P-type wells PW with a voltage corresponding to the operation mode such as erasure, write, or read. N-type well NW for separation is connected to a N-type well driver 11 for separation. Driver 11 provides N-type well NW for separation with a voltage corresponding to the operation mode such as erasure, write, or read.

A gate of each selecting gate SG is connected to a bit line selection circuit 12. Bit line selection circuit 12 makes selecting gate SG conductive that is either corresponding to bit line BL of an odd number or corresponding to bit line BL of an even number. Column selection circuit 6 connects main bit line MBL specified by Y decoder 5 to sense amplifier 7. Row decoders RD0 to RD3, drivers 10, 11, and bit line selection circuit 12 are included in X decoder 4 as illustrated in FIG. 2.

Figure 4:
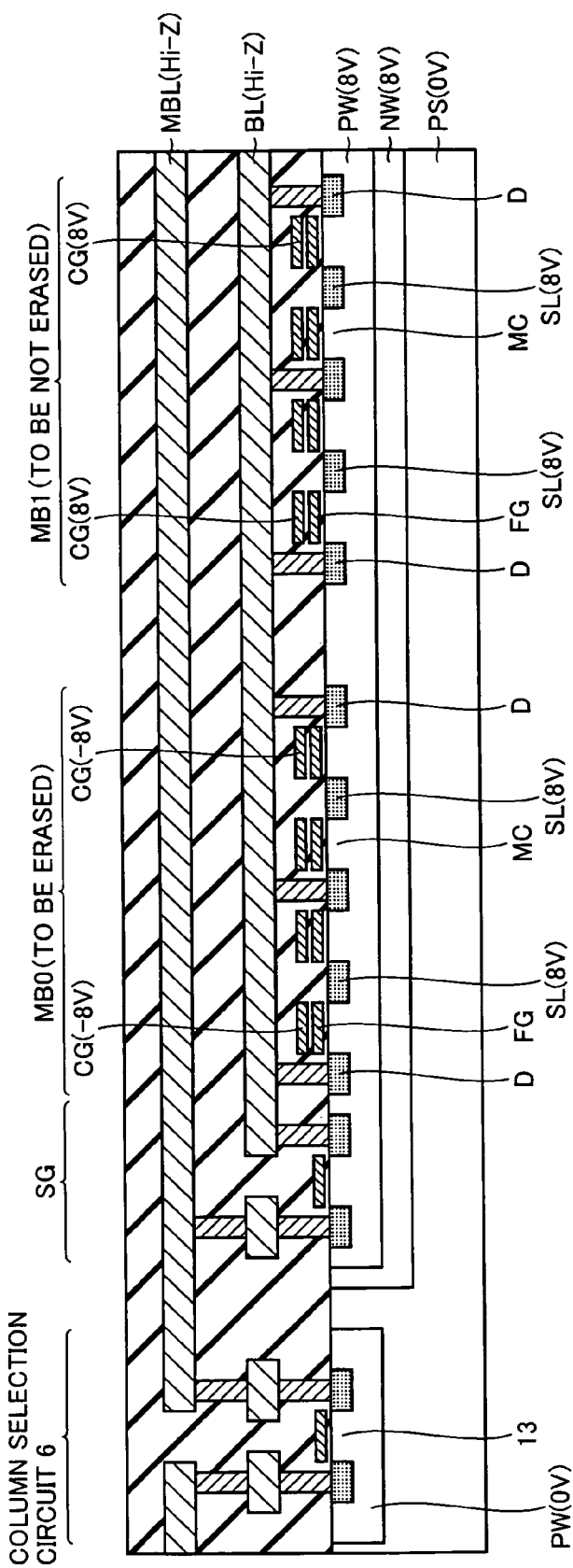
FIG. 4 is a cross-sectional view taken along line IV-IV in FIG. 3.
Figure 5:
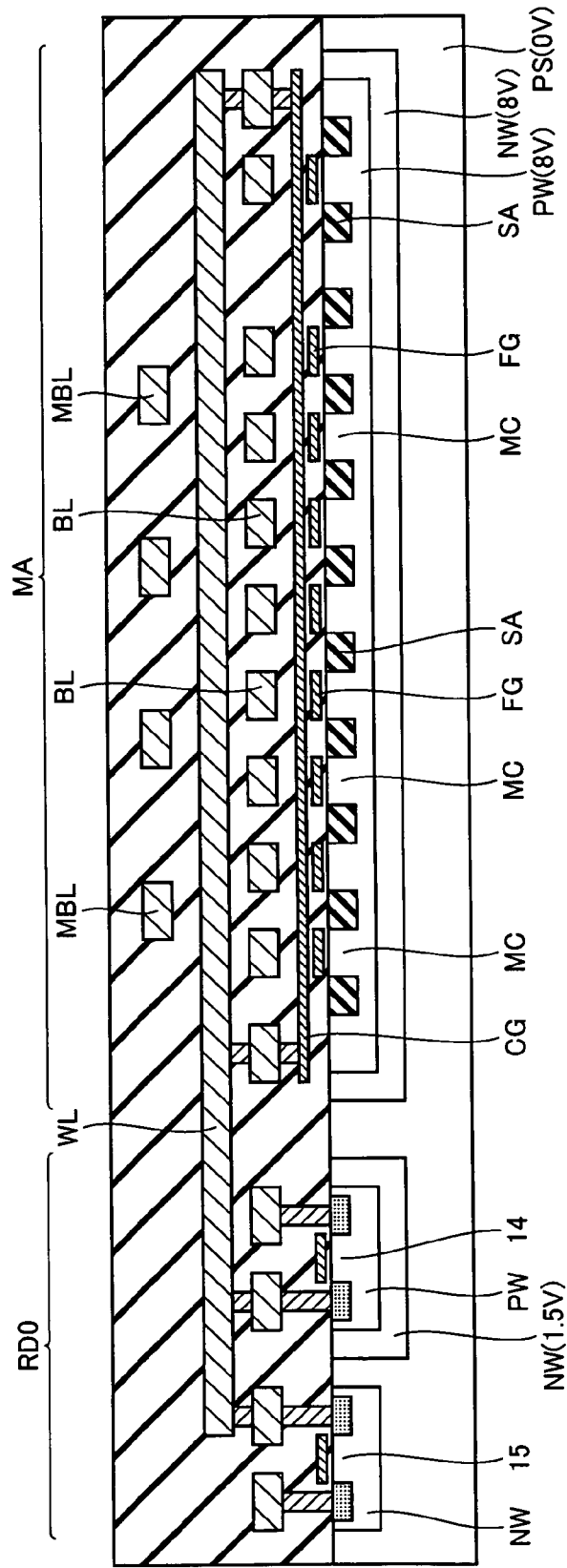
FIG. 5 is a cross-sectional view taken along line V-V in FIG. 3.

FIG. 4 is a cross-sectional view taken along line IV-IV in FIG. 3, and FIG. 5 is a cross-sectional view taken along line V-V in FIG. 3. The voltage level in the drawing is applied during the erase operation when memory block MB0 is to be erased and remaining memory blocks MB1 to MB3 are not to be erased. In FIG. 4 and FIG. 5, N-type well NW for separation is formed on a surface of a P-type substrate PS, P-type well PW is formed on a surface of N-type well NW for separation, and the plurality of memory cells MC is formed on the surface of P-type well PW.

Because P-type substrate PS generally is used as a wafer whose voltage is 0 V, an electrical short occurs and it is not possible to apply P-type well PW with a voltage of a level other than 0 V when P-type well PW and P-type substrate PS are in contact directly with each other. Therefore, N-type well NW is provided between P-type well PW and P-type substrate PS to electrically separate P-type well PW and P-type substrate PS. N-type well NW is brought into a reverse bias state by applying a potential of a level equal to or greater than the level for both P-type well PW and P-type substrate PS.

Each memory cell MC includes floating gate FG and control gate CG sequentially formed on the surface of P-type well PW, and source S and drain D formed on the both sides of gates FG and CG. As illustrated in FIG. 5, two same memory cells MC are separated by a separation region SA. Bit line BL is formed above each memory cell column, and as illustrated in FIG. 4, bit line BL is connected to the drain of corresponding memory cell MC. Main bit line MBL is formed above bit line BL, and main bit line MBL is connected to corresponding bit line BL via corresponding selecting gate (N-channel MOS transistor) SG, as well as to N-channel MOS transistor 13 included in column selection circuit 6. Transistor 13 is formed on a surface of P-type well PW independent from P-type well PW for memory array MA.

Further, as illustrated in FIG. 5, control gates CG for the plurality of memory cells MC in the same memory cell row are formed integrally, and word line WL is formed between bit line BL and main bit line MBL. Word line WL is connected to control gate CG of corresponding memory cell row at a plurality of points, as well as to N-channel MOS transistor 14 and P-channel MOS transistor 15 included in row decoder RD0. Transistors 14 and 15 are formed on surfaces of wells PW and NW, respectively, independent from P-type well PW for memory array MA.

Figure 6:
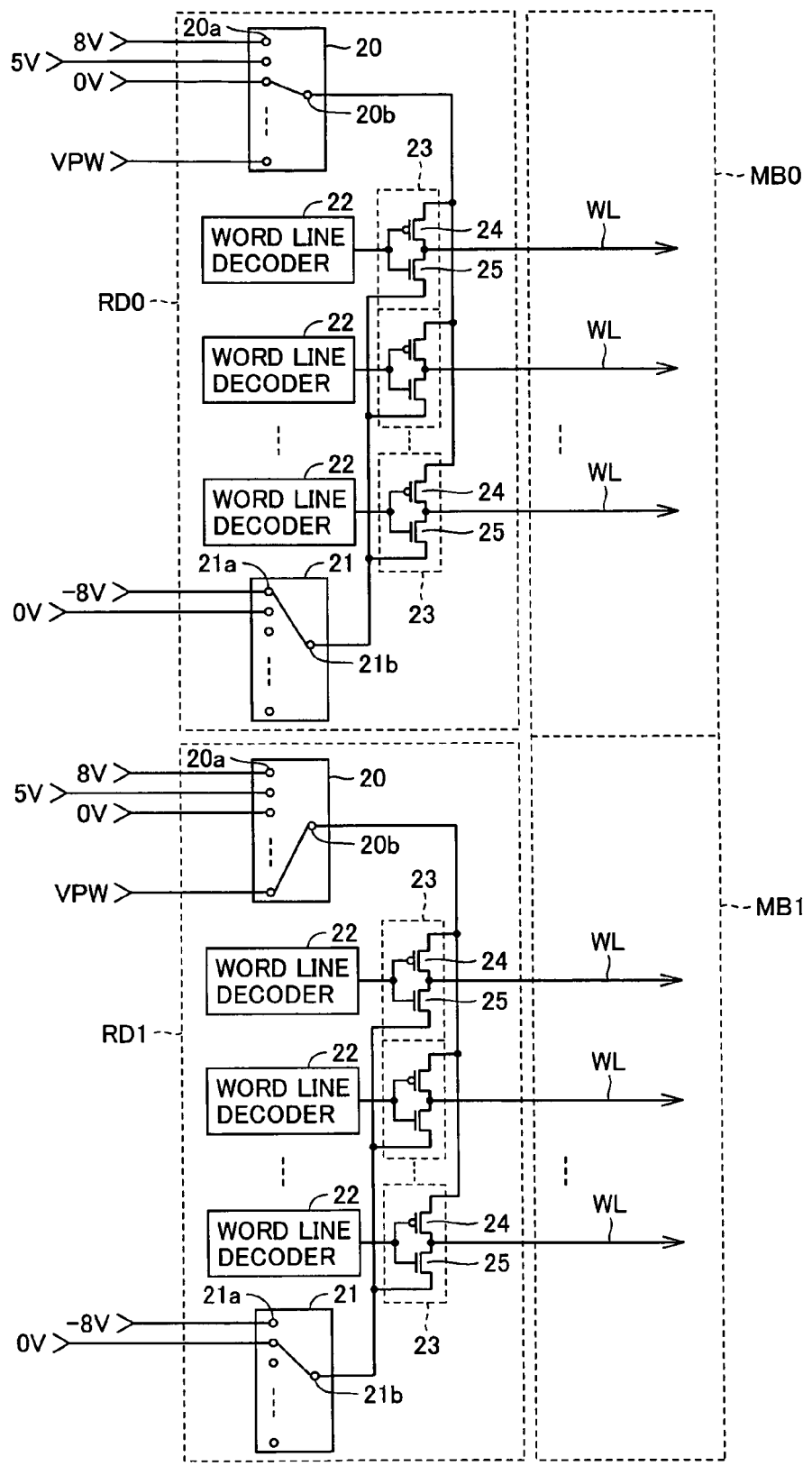
FIG. 6 is a circuitry block diagram illustrating a configuration of a row decoder illustrated in FIG. 3.

FIG. 6 is a circuitry block diagram illustrating a configuration of row decoders RD0 and RD1 illustrated in FIG. 3. In FIG. 6, row decoder RD0 includes a positive voltage selection circuit 20, a negative voltage selection circuit 21, and a word line decoder 22 and a word line driver 23 formed so as to correspond to each word line WL for corresponding memory block MB0.

Positive voltage selection circuit 20 includes a plurality of switching terminals 20a and a single common terminal 20b. The plurality of switching terminals 20a is provided with positive voltages 8 V, 5 V, . . . , and 0 V respectively generated in internal voltage generation circuit 1, and a P-type well voltage VPW outputted from source line P-type well driver 10. Positive voltage selection circuit 20 is controlled by such as control circuit 1, and connects one of the plurality of switching terminals 20a with common terminal 20, according to the operation mode such as erasure, write, or read. Common terminal 20b is provided with 8 V during the write operation, 5 V during the read operation, 0V during a standby mode, and P-type well voltage VPW during the erase operation.

Negative voltage selection circuit 21 includes a plurality of switching terminals 21a and a single common terminal 21b. The plurality of switching terminals 21a are provided respectively with negative voltages such as −8 V, . . . , and 0 V generated in internal voltage generation circuit 1. Negative voltage selection circuit 21 is controlled by control circuit 1, and connects one of the plurality of switching terminals 21a with common terminal 21b, according to the operation mode such as erasure, write, or read. Common terminal 21b is provided with 0 V during the write operation, the read operation, and a standby mode, and −8 V during the erase operation.

During the write operation and the read operation, word line decoder 22 outputs a signal of "L" level when the X address signal provided from address buffer 3 matches a X address signal previously assigned for corresponding word line WL, and otherwise outputs a signal of "H" level. Further, during the erase operation, word line decoder 22 outputs a signal of "L" level when a block selection signal included in the X address signal provided from address buffer 3 matches a block selection signal previously assigned for corresponding memory block MB, and otherwise outputs a signal of "H" level. Further, during the standby mode, word line decoder 22 outputs a signal of "H" level.

Driver 23 includes a P-channel MOS transistor 24 and a N-channel MOS transistor 25. P-channel MOS transistor 24 is connected between common terminal 20b for positive voltage selection circuit 20 and its corresponding word line WL, and a gate of P-channel MOS transistor 24 receives the signal outputted from corresponding word line decoder 22. N-channel MOS transistor 25 is connected between corresponding word line WL and common terminal 21b for negative voltage selection circuit 21, and a gate of N-channel MOS transistor 25 receives the signal outputted from corresponding word line decoder 22.

When the level of the signal outputted from corresponding word line decoder 22 is "H", N-channel MOS transistor 25 becomes conductive, and common terminal 21b for negative voltage selection circuit 21 and its corresponding word line WL are connected. When the level of the signal outputted from corresponding word line decoder 22 is "L", P-channel MOS transistor 24 becomes conductive, and common terminal 20b for positive voltage selection circuit 20 and corresponding word line WL are connected.

Each of row decoders RD1 to RD3 has the same configuration as row decoder RD0. FIG. 6 illustrates states of selection circuits 20 and 21 when memory block MB0 is to be erased and remaining memory blocks MB1 to MB3 are not to be erased.

Figure 7:
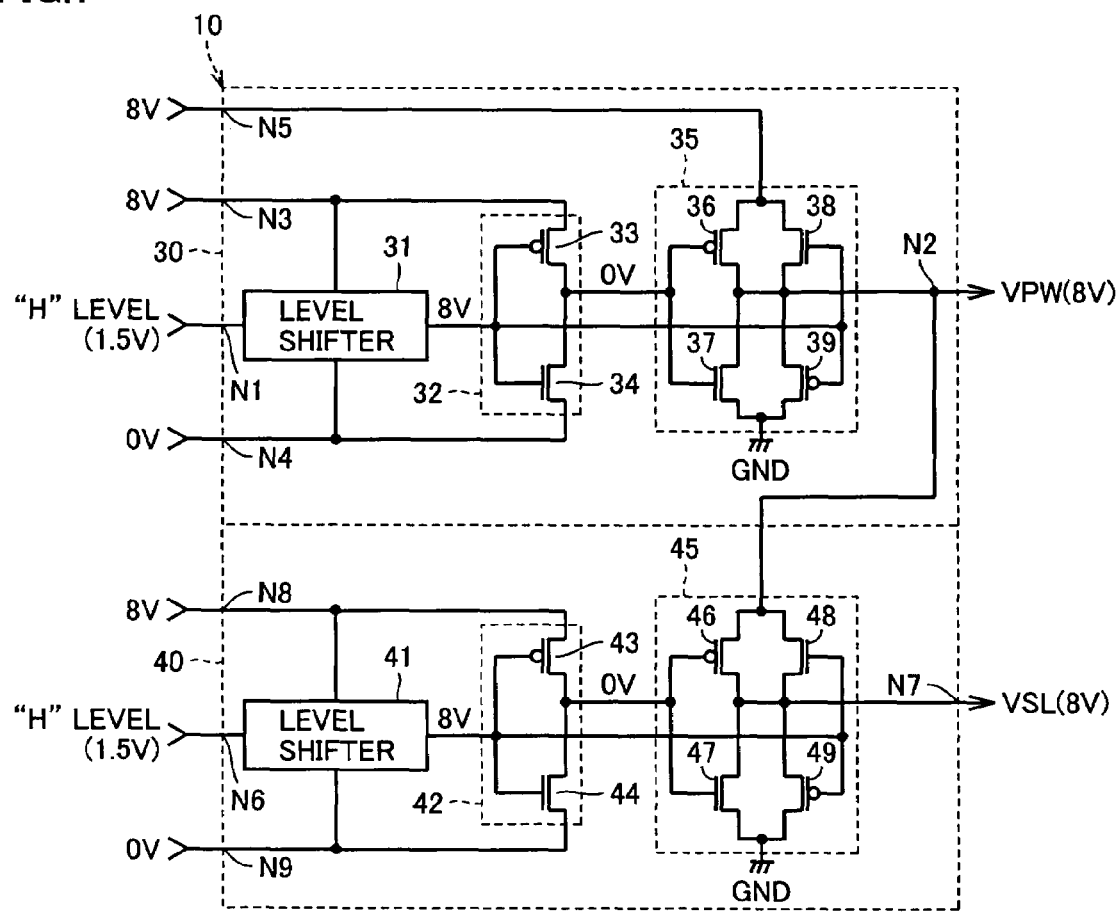
FIG. 7 is a circuitry block diagram illustrating a configuration of a source line P-type well driver illustrated in FIG. 3 and a voltage level during an erase operation.

FIG. 7 is a circuitry block diagram illustrating a configuration of source line P-type well driver 10 illustrated in FIG. 3. The voltage level in the drawing represents a voltage level during the erase operation. In FIG. 7, source line P-type well driver 10 is provided with a P-type well driver 30 and a source line driver 40.

P-type well driver 30 includes a level shifter 31 and inverters 32 and 35 that are connected in series between an input node N1 and an output node N2. Level shifter 31 outputs a voltage of a power supply node N3 (8 V) when input node N1 is provided with a signal of "H" level (1.5 V), and outputs a voltage of a power supply node N4 (0 V) when input node N1 is provided with a signal of "L" level (0 V). Inverter 32 includes a P-channel MOS transistor 33 and an N-channel MOS transistor 34 that are connected in series between power supply nodes N3 and N4, and gates of transistors 33 and 34 receive signals outputted from level shifter 31. Inverter 32 outputs the voltage of power supply node N4 (0 V) when provided with a signal of "H" level (8 V) from level shifter 31, and outputs the voltage of power supply node N3 (8 V) when provided with a signal of "L" level (0 V) from level shifter 31.

Inverter 35 includes a P-channel MOS transistor 36 and an N-channel MOS transistor 37 that are connected in series between a power supply node N5 and a line for a ground voltage GND (0 V), and gates of transistors 36 and 37 receive signals outputted from previous inverter 32. Inverter 35 further includes an N-channel MOS transistor 38 and a P-channel MOS transistor 39 that are connected in series between power supply node N5 and a line for ground voltage GND (0 V), and gates of transistors 38 and 39 receive signals from level shifter 31. Inverter 35 outputs the voltage of power supply node N5 (8 V) when provided with a signal of "L" level (0 V) from previous inverter 32, and outputs ground voltage (0V) when provided with a signal of "H" level (8 V) from previous inverter 32.

Source driver 40 includes a level shifter 41 and inverters 42 and 45 that are connected in series between an input node N6 and an output node N7. Level shifter 41 outputs a voltage of a power supply node N8 (8 V) when input node N6 is provided with a signal of "H" level (1.5 V), and outputs a voltage of a power supply node N9 (0 V) when input node N6 is provided with a signal of "L" level (0 V). Inverter 42 includes a P-channel MOS transistor 43 and an N-channel MOS transistor 44 that are connected in series between power supply nodes N8 and N9, and gates of transistors 43 and 44 receive signals from level shifter 41. Inverter 42 outputs the voltage of power supply node N9 (0 V) when provided with a signal of "H" level (8 V) from level shifter 41, and outputs the voltage of power supply node N8 (8 V) when provided with a signal of "L" level (0 V) from level shifter 41.

Inverter 45 includes a P-channel MOS transistor 46 and an N-channel MOS transistor 47 that are connected in series between an output node N2 of P-type well driver 40 and the line of ground voltage GND (0V), and gates of transistors 46 and 47 receive signals outputted from previous inverter 42. Inverter 45 further includes an N-channel MOS transistor 48 and a P-channel MOS transistor 49 that are connected in series between output node N2 of P-type well driver 40 and the line of ground voltage GND (0V), and gates of transistors 48 and 49 receive signals outputted from level shifter 41. Inverter 45 outputs P-type well voltage VPW (8 V) when a signal of "L" level (0 V) is outputted from previous inverter 42, and outputs ground voltage (0V) when a signal of "H" level (8 V) is outputted from previous inverter 42.

Consequently, during the erase operation, input nodes N1 and N6 are provided with a signal of "H" level (1.5 V), power supply nodes N3, N5, and N8 are provided with 8 V, power supply nodes N4 and N9 are provided with 0 V, and P-type well voltage VPW and source line voltage VSL are 8 V.

Figures 8, 9:
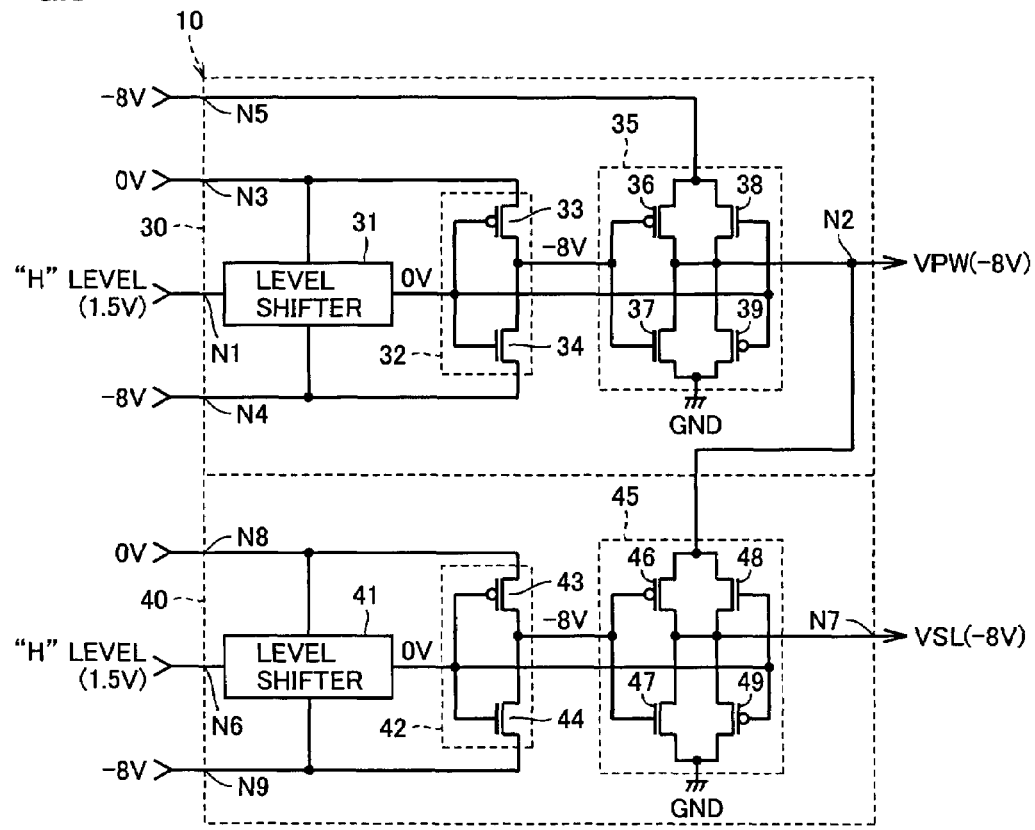
FIG. 8 is a circuitry block diagram illustrating a configuration of the source line P-type well driver illustrated in FIG. 3 and a voltage level during a pre-erasure write operation.
FIG. 9 illustrates voltages applied to the memory cells, respectively during the erase operation and the pre-erasure write operation of the flash memory illustrated in FIGS. 1A to FIG. 7.

Further, during the pre-erasure write operation, as illustrated in FIG. 8, input nodes N1 and N6 are provided with a signal of "H" level (1.5 V), power supply nodes N3 and N8 are provided with 0 V, and power supply nodes N4, N5, and N9 are provided with −8 V, and P-type well voltage VPW and source line voltage VSL are −8 V.

Now, an operation of the flash memory illustrated in FIG. 1A to FIG. 8 is described. FIG. 9 illustrates voltages applied to memory cells MC in a block to be erased and a block to be not erased, respectively during the erase operation and the pre-erasure write operation of the flash memory. Further, FIG. 10 is a time chart illustrating changes over time during the erase operation of a source line voltage VSL, a P-type well voltage VPW, an N-type well voltage VNW, a word line voltage VWL for blocks to be not erased (MB1 to MB3 in this example), and word line voltage VWL for blocks to be erased (MB0 in this example).

Referring to FIG. 10, during the standby mode, source line voltage VSL, P-type well voltage VPW, N-type well voltage VNW, and word line voltage VWL for all memory blocks MB0 to MB3 are fixed to 0 V. Then, at time t1, source line voltage VSL, P-type well voltage VPW, N-type well voltage VNW, and word line voltage VWL for memory blocks MB1 to MB3 that are not to be erased rise to 8 V from 0 V. At this time, as illustrated in FIG. 6 and FIG. 7, because P-type well voltage VPW is provided for source line SL and word line WL, voltages VPW, VSL, and VWL rise to 8 V at the same speed. Thus, it is possible to prevent the threshold voltage for memory cell MC not to be erased from shifting due to a potential difference caused between word line WL, P-type well PW, and source line SL. The voltage for the drain of memory cell MC becomes 7.4 V, which is smaller than P-type well voltage VPW (8 V) by a built-in potential (0.6 V) of a P-N junction.

Next, at time t2, the voltage for all word lines WL memory block MB0 to be erased falls from 0 V to −8 V. With this, as illustrated in FIG. 1E, electrons are withdrawn from floating gate FG of each memory cell MC of memory block MB0 to source S, thereby decreasing the threshold voltage for each memory cell MC.

Next, at time t3, the voltage for word line WL memory block MB0 rises from −8 V to 0 V. Then, at time t4, source line voltage VSL, P-type well voltage VPW, N-type well voltage VNW, and word line voltage VWL for memory blocks MB1 to MB3 to be not erased fall from 8 V to 0 V, and thus completing erasure of the data for memory block MB0 to be erased.

During the pre-erasure write operation, first, source line voltage VSL, P-type well voltage VPW, a bit line voltage VBL, and word line voltage VWL memory blocks MB1 to MB3 to be not erased fall from 0 V to −8 V. Then, the voltage for all word lines WL for memory block MB0 to be erased rises from 0 V to 8V. With this, electrons are injected into floating gate FG of each memory cell MC for memory block MB0, thereby increasing the threshold voltage for each memory cell MC.

Next, word line voltage VWL for memory block MB0 falls from 8 V to 0 V. Then, source line voltage VSL, P-type well voltage VPW, and word line voltage VWL for memory blocks MB1 to MB3 to be not erased rise from −8 V to 0 V, and thus completing the pre-erasure writing for memory block to be erased MB0. During the pre-erasure write operation, N-type well voltage VNW is not necessarily be equal to P-type well voltage VPW, as long as VNW is greater than VPW. For example, a voltage not less than 0 V may be applied to N-type well NW. The operations for normal write and read are illustrated in FIG. 1(a) to (h), and not described here.

Second Embodiment

With a flash memory in which each memory block MB is formed in independent P-type well PW, while a row decoder RD for a memory block MB to be erased is required to reduce corresponding word line WL from 0 V to −8 V, row decoder RD for memory block MB to be not erased only needs to maintain corresponding word line WL at 0 V.

However, with the flash memory according to First Embodiment, in which plurality of memory blocks MB0 to MB3 are formed on the surface of single P-type well PW, in addition to the fact that row decoder RD0 for memory block MB0 to be erased is required to reduce corresponding word line WL from 0 V to −8 V, row decoders RD1 to RD3 for memory blocks MB1 to MB3 to be not erased is required to increase corresponding word line WL from 0 V to 8 V.

As a result, each row decoder RD according to First Embodiment needs to detect that corresponding memory block MB becomes an object to be erased, as well as that another memory block MB becomes an object to be erased. Accordingly, row decoder RD for the flash memory according to First Embodiment should be greater in size than row decoder RD for the flash memory in which each memory block MB is formed in independent P-type well PW.

In case with a flash memory module mounted on a flash memory consolidated micro computer, as illustrated in FIG. 1l, the plurality of memory blocks MB0 to MB3 are formed in one P-type well PW, and each of other plurality of memory blocks MB10 to MB12 is formed in independent P-type well PW. In FIG. 11, memory blocks MB10, MB0 to MB3, MB11, and MB12 are sequentially arranged in a Y direction in the drawing (a direction in which bit line BL extends), row decoders RD10, RD0 to RD3, RD11, and RD12 for memory blocks MB10, MB0 to MB3, MB11, and MB12 are disposed adjacent to the corresponding memory blocks in an X direction in the drawing (a direction in word line WL extends), and further internal voltage generation circuit 1 is disposed adjacent in the X direction. Further, a sense amplifier band 50, a peripheral circuitry 51, and control circuit 9 are disposed, respectively adjacent to memory block MB12, row decoder RD12, and internal voltage generation circuit 1 in the Y direction in the drawing. In sense amplifier band 50, sense amplifier 7 and the like are disposed, and peripheral circuitry 51 includes input-output buffer 8 and the like.

As described above, because row decoders RD0 to RD3 for memory blocks MB0 to MB3 are greater than row decoders RD10 to RD12 for memory blocks MB10 to MB12, a width of row decoders RD0 to RD3 also becomes greater than a width of row decoder RD10 to RD12, and row decoders RD0 to RD3 protrude into a region of internal voltage generation circuit 1.

On the other hand, with the flash module mounted on the flash memory consolidated microcomputer, a required amount of memory varies depending on the application of the microcomputer on which the memory is to be mounted. Accordingly, it is common that one or more memory blocks MB are deleted to reduce the amount of memory to develop products with a smaller capacity.

In this case, as illustrated in FIG. 11, if memory blocks MB0 to MB3 are disposed between memory blocks MB10 to MB11, in order to delete memory blocks MB11 and MB12 and row decoders RD11 and RD12 to move memory blocks MB10, MB0 to MB3 and row decoders RD0 to RD3 to a side of sense amplifier band 50, the protruded portions of row decoders RD0 to RD3 are also have to be moved. This requires internal voltage generation circuit 1 to be laid out again, thereby reducing easiness of development of products with a smaller capacity.

Figure 12:
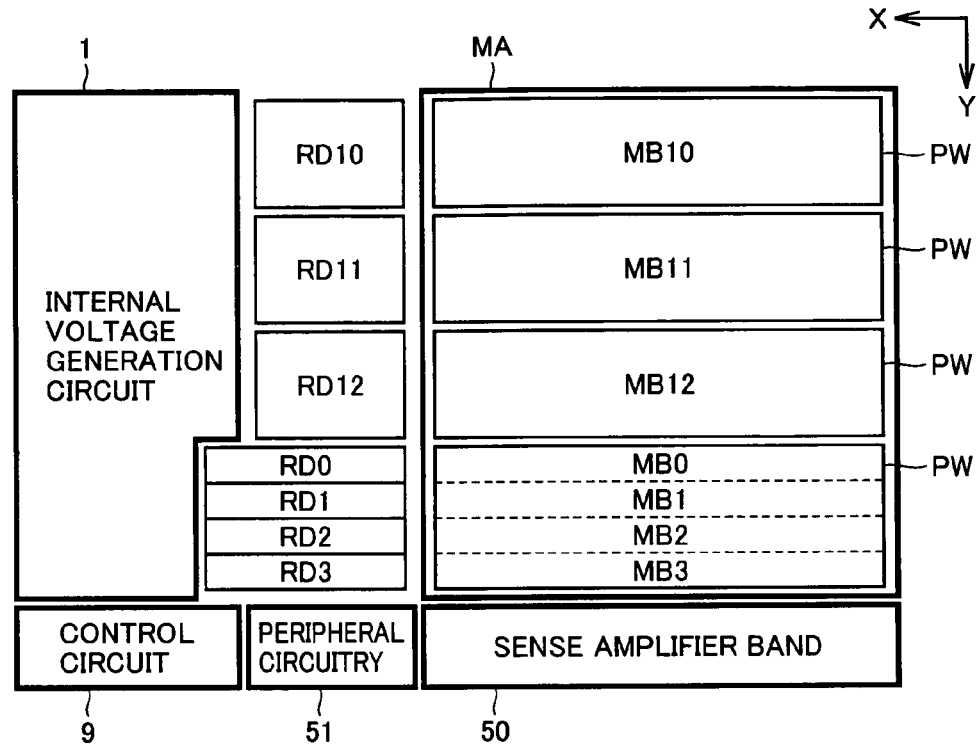
FIG. 12 is a block diagram illustrating a layout of a flash module according to Second Embodiment.

Thus, in this Second Embodiment, as illustrated in FIG. 12, memory blocks MB10 to MB12 and MB0 to MB3, and sense amplifier band 50 are disposed in the stated order, and row decoders RD10 to RD12, and RD0 to RD3 are disposed adjacent to memory blocks MB10 to MB12 and MB0 to MB3. With such an arrangement, internal voltage generation circuit 1 is not required to be laid out again even when memory blocks MB10 to MB12 and row decoders RD10 to RD12 are deleted, development of products with a smaller capacity is facilitated.

Figure 13:
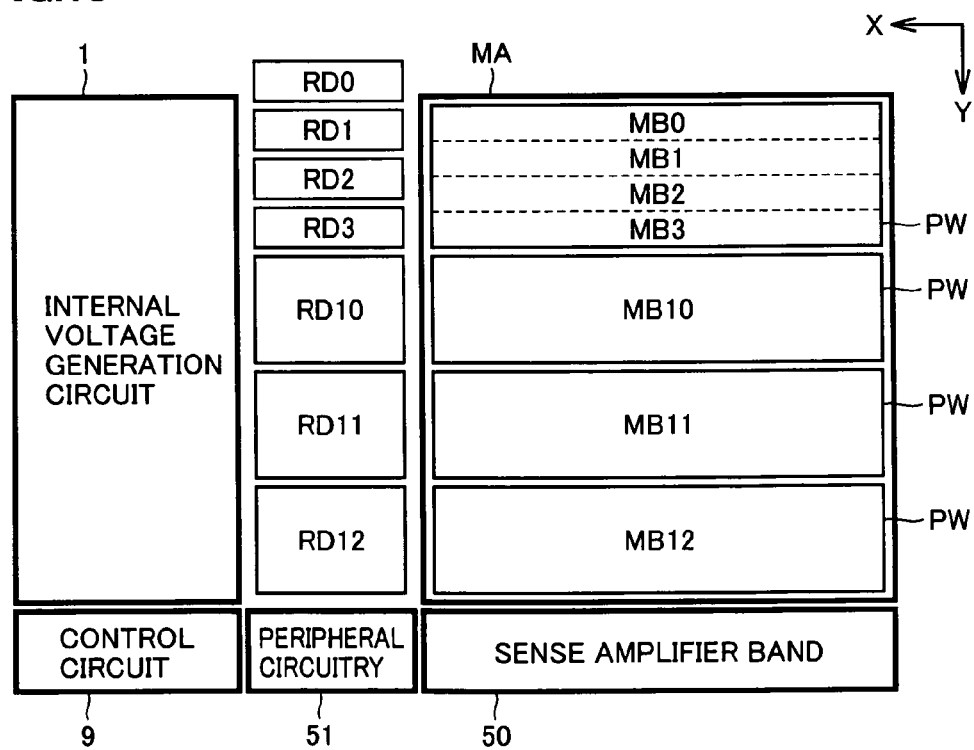
FIG. 13 is a block diagram illustrating a modified example of Second Embodiment.

Further, FIG. 13 is a block diagram illustrating a modified example of Second Embodiment. In FIG. 13, with this modified example, memory blocks MB0 to MB3 and MB10 to MB12, and sense amplifier band 50 are disposed in the stated order, and row decoders RD0 to RD3 and RD10 to RD12 are disposed adjacent to memory blocks MB0 to MB3 and MB10 to MB12. Further, row decoders RD0 to RD3 and RD10 to RD12 are laid out with the same width so that portions of row decoders RD0 to RD3 protrudes in the Y direction in the drawing. With such an arrangement, internal voltage generation circuit 1 is not required to be laid out again even when memory blocks MB10 to MB12 and row decoders RD10 to RD12 are deleted, because it is only necessary to move memory blocks MB0 to MB3 and row decoders RD0 to RD3 to the side of sense amplifier band 50. Thus, development of products with a smaller capacity is facilitated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nonvolatile semiconductor memory device, comprising:
    a plurality of memory blocks formed on a surface of a single well, each memory block having a plurality of memory cells that are arranged in a plurality of rows and a plurality of columns, and a word line provided corresponding to each row and connected to a gate of corresponding each memory cell; and
    an erase circuit conducting batch erasure of stored data for said plurality of memory cells included in a memory block to be erased out of said plurality of memory blocks, wherein
    a source of each memory cell of said plurality of memory blocks is connected to a predetermined node, and
    said erase circuit includes:
    a first drive circuit applying a first voltage to said well and said predetermined node; and
    a second drive circuit applying the output voltage of said first drive circuit to each word line of a memory block to be not erased out of said plurality of memory blocks, as well as a second voltage to each word line of the memory block to be erased, the second voltage being different said first voltage.

2. A nonvolatile semiconductor memory device, comprising:
    a plurality of memory blocks formed on a surface of a single well, each memory block having a plurality of memory cells that are arranged in a plurality of rows and a plurality of columns, and a word line provided corresponding to each row and connected to a gate of corresponding each memory cell; and
    an erase circuit conducting batch erasure of stored data for said plurality of memory cells included in a memory block to be erased out of said plurality of memory blocks, wherein
    a source of each memory cell of the memory block to be erased and a source of each memory cell of a memory block to be not erased are connected to a predetermined node,
    said erase circuit includes:
    a first drive circuit applying a first voltage to said well and said predetermined node; and
    a second drive circuit applying the output voltage of said first drive circuit to each word line of said memory block to be not erased, as well as a second voltage to each word line of the memory block to be erased, the second voltage being different said first voltage.

3. The nonvolatile semiconductor memory device according to claim 2, wherein
    said first drive circuit includes:
    a first sub drive circuit applying said first voltage to said well; and
    a second sub drive circuit applying the output voltage of said first sub drive circuit to said predetermined node.

4. The nonvolatile semiconductor memory device according to claim 2, wherein
    said second drive circuit applies said second voltage to the word line of said memory block to be erased after applying the output voltage of said first drive circuit to the word line of said memory block to be not erased.

5. The nonvolatile semiconductor memory device according to claim 2, wherein
    said plurality of memory blocks share a plurality of bit lines, and
    said plurality of bit lines are each provided corresponding to a plurality of columns of said plurality of memory blocks, each bit line being connected to a drain of a corresponding memory cell.

6. A nonvolatile semiconductor memory device, comprising:
    a plurality of first memory blocks formed on a surface of a single first well, each first memory block having a plurality of memory cells that are arranged in a plurality of rows and a plurality of columns, and a word line provided corresponding to each row and connected to a gate of corresponding each memory cell;
    a first row decoder provided corresponding to each of the first memory blocks, the first row decoder applying a first voltage that is different from a second voltage applied to said first well to a corresponding word line when the corresponding first memory block is to be erased, and the first row decoder applying said second voltage to the corresponding word line when the corresponding first memory block is to be not erased but another first memory block is to be erased;
    a plurality of second memory blocks respectively formed on surfaces of a plurality of second wells, each second memory block having a plurality of memory cells that are arranged in a plurality of rows and a plurality of columns, and a word line provided corresponding to each row and connected to a gate of a corresponding memory cell; and
    a second row decoder provided corresponding to each of the second memory blocks, the second row decoder applying a third voltage that is different from a fourth voltage applied to said second well to a corresponding word line when the corresponding second memory block is to be erased, and the second row decoder applying said fourth voltage to the corresponding word line when the corresponding second memory block is to be not erased, wherein said plurality of first memory blocks and said plurality of second memory blocks are sequentially arranged in a first direction that is perpendicular to a second direction in which said word line extends, a plurality of said first row decoders and a plurality of second row decoders are sequentially arranged in said first direction adjacent to said plurality of first memory blocks and said plurality of second memory blocks in said second direction.

7. The nonvolatile semiconductor memory device according to claim 6, further comprising:

an internal voltage generation circuit generating said first to fourth voltages, wherein the plurality of said first row decoders and the plurality of said second row decoders are provided between said plurality of first and second memory blocks and said internal voltage generation circuit.

8. The nonvolatile semiconductor memory device according to claim 6, wherein a total length of the plurality of said first row decoders in said first direction is greater than a total length of said plurality of first memory blocks in said first direction, and a length of said first row decoder in said first direction is equal to or shorter than a length of said second row decoder in said second direction.

* * * * *